United States Patent
Talluri

(10) Patent No.: US 10,438,756 B2
(45) Date of Patent: Oct. 8, 2019

(54) METHOD FOR ESTIMATING AN ELECTRICAL OPERATING TIME OF A CIRCUIT BREAKER USING CURRENT FEEDBACK

(71) Applicant: ABB Schweiz AG, Baden (CH)

(72) Inventor: Anil Talluri, Bangalore (IN)

(73) Assignee: ABB Schweiz AG, Baden (CH)

( * ) Notice: Subject to any disclaimer, the term of this patent is extended or adjusted under 35 U.S.C. 154(b) by 306 days.

(21) Appl. No.: 15/531,290

(22) PCT Filed: Nov. 30, 2015

(86) PCT No.: PCT/IB2015/059211
§ 371 (c)(1),
(2) Date: May 26, 2017

(87) PCT Pub. No.: WO2016/084055
PCT Pub. Date: Jun. 2, 2016

(65) Prior Publication Data
US 2017/0358404 A1    Dec. 14, 2017

(30) Foreign Application Priority Data

Nov. 30, 2014   (IN) .......................... 5993/CHE/2014

(51) Int. Cl.
*H01H 9/56*     (2006.01)
*H01H 33/59*    (2006.01)
(Continued)

(52) U.S. Cl.
CPC ............... *H01H 9/56* (2013.01); *G04F 10/10* (2013.01); *H01H 9/563* (2013.01);
(Continued)

(58) Field of Classification Search
CPC ........ H01H 9/56; H01H 9/563; H01H 33/593; H01H 2009/566; H03K 17/16; H03K 17/28; G04F 10/10
(Continued)

(56) References Cited

U.S. PATENT DOCUMENTS 3,808,455 A  *  4/1974  Leisi .................... H01H 33/593
                                                              361/3
5,119,260 A     6/1992  Huhse et al.
(Continued)

FOREIGN PATENT DOCUMENTS

WO        2012152829 A1    11/2012

OTHER PUBLICATIONS

"Controlled Switching Buyer's and Application Guide", Aug. 19, 2013, 54 pages.
(Continued)

*Primary Examiner* — Zeev V Kitov
(74) *Attorney, Agent, or Firm* — Barnes & Thornburg LLP

(57) ABSTRACT

In aspects, the present invention discloses a method of determining an electrical operating time of a circuit breaker (140) in a multiphase electrical system having a subsystem (160) connectable to a power source (110) through a circuit breaker (140) operated by a controller (130). The controller is connected to a current transformer (120, 150) for measuring current of the subsystem in a one phase. The method comprises monitoring the current of the subsystem in the one phase, determining a first rate of change from the monitored current in the one phase, detecting an instance of switching in an another phase based on the first rate of change, and determining an electrical operating time of the circuit breaker in the another phase based on the detected instance of switching and an instance at which a command
(Continued)

for switching in the another phase was provided to the circuit breaker.

7 Claims, 4 Drawing Sheets

(51) Int. Cl.
- *H03K 17/28* (2006.01)
- *H03K 17/16* (2006.01)
- *G04F 10/10* (2006.01)
- *H03K 17/13* (2006.01)

(52) U.S. Cl.
CPC ........... *H01H 33/593* (2013.01); *H03K 17/16* (2013.01); *H03K 17/28* (2013.01); *H01H 2009/566* (2013.01); *H03K 17/13* (2013.01)

(58) Field of Classification Search
USPC ........................................................ 361/115
See application file for complete search history.

(56) References Cited

U.S. PATENT DOCUMENTS

| | | | |
|---|---|---|---|
| 6,172,863 B1 * | 1/2001 | Ito | H01H 33/593 |
| | | | 323/908 |
| 8,503,142 B2 * | 8/2013 | Meyer | H02H 7/30 |
| | | | 361/115 |
| 2007/0285850 A1 * | 12/2007 | Koyama | H01H 9/563 |
| | | | 361/2 |
| 2009/0027824 A1 | 1/2009 | Allen et al. | |

OTHER PUBLICATIONS

International Search Report, International Application No. PCT/IB2015/059211, search completed Jan. 28, 2016, 4 pages.

International Written Opinion issued in connection with International Application No. PCT/IB2015/059211, dated Jan. 28, 2016, 6 pages.

International Preliminary Report on Patentability, International Application No. PCT/IB2015/059211, search completed Jun. 6, 2017, 7 pages.

* cited by examiner

METHOD FOR ESTIMATING AN ELECTRICAL OPERATING TIME OF A CIRCUIT BREAKER USING CURRENT FEEDBACK

CROSS-REFERENCE TO RELATED APPLICATIONS

This application is a U.S. national stage of International Application Serial No. PCT/IB2015/059211, filed Nov. 30, 2015, which claims priority to Indian Patent Application No. 5993/CHE/2014, filed Nov. 30, 2014. The entire disclosures of both of the foregoing applications are hereby incorporated by reference.

FIELD OF THE INVENTION

The present invention relates to point on wave controllers. More particularly, the present invention relates to estimating an electrical operating time of a circuit breaker by detecting a plurality of switching instances in a plurality of phases using a point on wave controller based on current feedback from a single phase.

BACKGROUND

In power systems, circuit breakers are used for connecting and disconnecting a load. During this process, the active elements of the circuit breaker either interrupt or incept high current, causing stresses in the circuit breaker as well as the connected power system components. The flow of the high current can be limited by closing and opening the circuit breaker at a specific instance on the source voltage waveform. A plurality of techniques are known for controlling the opening or closing of the circuit breaker in order to prevent generation of transient phenomenon. Such techniques rely on the usage of devices that perform synchronized switching control. One such device is the point on wave controller.

Point on wave controller is used for controlling the switching instance of the circuit breaker. On receiving a command from a control unit, the point on wave controller advances the command to achieve closing or opening at an instance to minimize the current. The point on wave controller detects the opening or closing actuation time (also referred to as operating time) of the circuit breaker and calculates a time for switching in respect of the opening or closing command of the circuit breaker to ensure switching on a particular point on the voltage waveform in a corresponding phase. The point on wave controller determines the electrical operating time as the time period between the instance at which the command was given to the circuit breaker and the instance at which electrical switching (i.e. interruption or inception of the electrical connection) happened in a corresponding phase.

Conventionally, for detecting switching instance in a phase, the point on wave controller relies on current measurements from that phase from a current sensor connected to the load. In a multiphase electrical system, current in the plurality of phases of the multiphase electrical system is monitored using one or more current transformers. Based on the current feedback from the plurality of phases, the point on wave controller determines a plurality of instances of switching in the plurality of corresponding phases.

However, when a current feedback is not available for a particular phase, instance of switching cannot be detected in that phase. Therefore, when a current transformer which measures the current in that phase is unavailable, for example due to fault or has become unreliable, the point on wave controller is not able to detect any instance of switching in that phase and is unable to determine the electrical operating time of the circuit breaker in that phase. In absence of relatively accurate electrical operating time of the circuit breaker in a phase, point on wave switching cannot be adapted for correcting errors in such scenarios.

Additionally, for monitoring current in the phases, a plurality of current transformers have to installed in the phases and these current transformers have to connected to the controller via appropriate wired or wireless connections. This requires substantial investment and effort during installation.

Therefore, in light of the abovementioned discussion, there is a need for a method and system that address the issues mentioned above.

BRIEF DESCRIPTION OF THE INVENTION

The above-mentioned shortcomings, disadvantages and problems are addressed herein which will be understood by reading and understanding the following specification.

In one aspect, the present invention provides a method of determining an electrical operating time of a circuit breaker for performing point on wave switching in a multiphase electrical system. The multiphase electrical system has a power source connectable to a subsystem, through the circuit breaker. The circuit breaker is operated by a controller.

The method comprises monitoring the current of the subsystem in the one phase, determining a first rate of change from the monitored current in the one phase, detecting an instance of switching in an another phase based on the first rate of change associated with current of the subsystem in the one phase of the multiphase electrical system, and determining an electrical operating time of the circuit breaker in the another phase based on the detected instance of switching and an instance at which a command for switching in the another phase was provided to the circuit breaker.

The another phase is one of a phase that succeeds the one phase in a sequence of switching during a closing operation, and a phase that precedes the one phase in a sequence of switching during an opening operation.

In an embodiment, the one phase is one of a last phase in a sequence of switching during the opening operation and a first phase in a sequence of switching during the closing operation.

In an embodiment, the method further comprises estimating a time for switching in the another phase the circuit breaker, based on the determined electrical operating time of the circuit breaker in the another phase and system characteristics data associated with the subsystem. In an embodiment, the method further comprises associating the detected instance of switching with the another phase based a predetermined sequence of switching.

In an embodiment, detecting the at least one instance of switching further comprises: monitoring current of the subsystem in at least one phase through a current measuring means (such as a current transformer), calculating at least one second rate of change from the current in the at least one phase within a predetermined window, and determining a ratio based on the first rate of change and the at least one second rate of change for detecting the instance of switching in the another phase.

In an embodiment, the method further comprises selecting the one phase from one or more phases from a plurality of phases of the multiphase electrical system, and modifying a sequence of switching whereby the one phase is one of a first phase to close during a closing operation and a last phase to open during an opening operation. Current from each phase of the one or more phases is monitored by the controller.

In another aspect, the current invention discloses a controller configured to operate a circuit breaker in a multiphase electrical system having a subsystem connectable to a power source, wherein the controller is connected to a current transformer for measuring current of the subsystem in a one phase. The controller comprises one or more processors configured to monitor the current of the subsystem in the one phase, determine a first rate of change from the monitored current in the one phase, detect an instance of switching in an another phase based on the first rate of change of current of the subsystem in the one phase of the multiphase electrical system, determine an electrical operating time of the circuit breaker in the another phase, based on the detected instance of switching, and estimate a time for switching in the another phase based on the determined electrical operating time of the circuit breaker and system characteristics data associated with the subsystem. The controller also includes a memory module functionally coupled to the one or more processors.

Systems and methods of varying scope are described herein. In addition to the aspects and advantages described in this summary, further aspects and advantages will become apparent by reference to the drawings and with reference to the detailed description that follows.

DETAILED DESCRIPTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Figure 1:
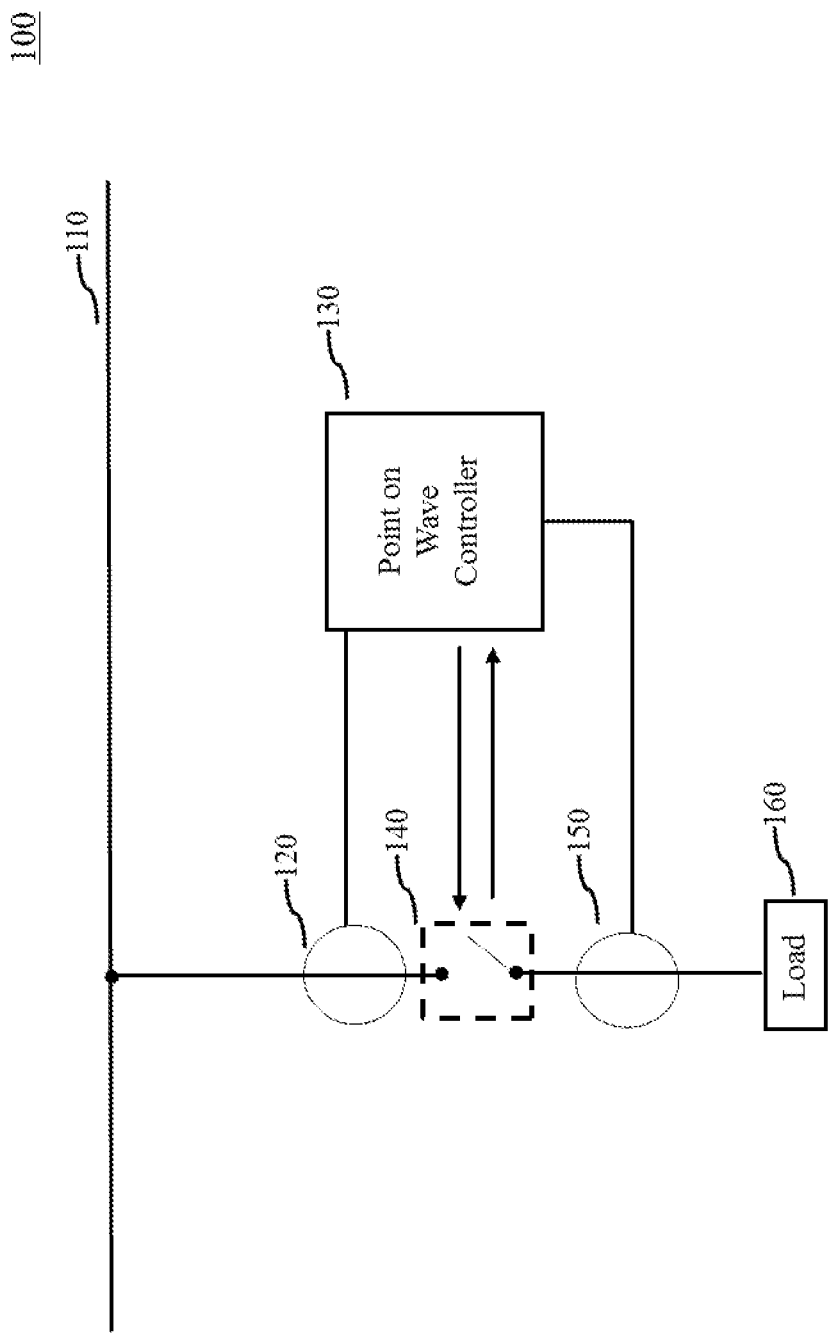
FIG. 1 illustrates a typical single line representation of a multiphase electrical system, in accordance with various embodiments of the present invention.

FIG. 1 illustrates a multiphase electrical system 100. The multiphase electrical system 100 includes a power source (represented in figure as a bus 110). The power source 110 can be connected to an electrical subsystem or load 160 through a circuit breaker 140. The circuit breaker can perform a closing operation to establish electrical connection between the power source 110 and the subsystem 160 in a phase and an opening operation to interrupt the electrical connection between the power source 110 and the subsystem 160 in a phase. The closing operation and opening operation are generally referred to as switching.

The subsystem 160 has at least two phases which are coupled with each other. Change in current in one coupled phase is also reflected in the current in the other coupled phase. For example, the electrical subsystem 160 is a three phase transmission line with inter phase coupling between the phases L1, L2 and L3. In the example, L1 phase of the transmission line is connected to the power source 110. When L2 phase of the power source 110 is being switched, a disturbance or interference is seen in the current in L1 phase due to the inter phase coupling.

The circuit breaker 140 is provided for protection and switching purposes. Opening and closing of the circuit breaker 140 is controlled by a point on wave controller 130 (also referred to as an intelligent electronic device 130 or controller 130). The point on wave controller 130 is used to determine appropriate switching instances for operating the corresponding circuit breaker 140 to ensure minimal electrical disturbance in the electrical system 100, and to ensure that electrical and mechanical shock generated while switching are minimal. The point on wave controller 130 is configured to receive information relating to current (also referred to as current feedback) of the subsystem 160 in one phase from a current measuring means such as a current transformer 120 or current transformer 150.

The point on wave controller 130 includes one or more processors for computation and determination of electrical operating time of the circuit breaker 140, a memory module functionally coupled to the one or more processors for storing information required to determine an electrical operating time of the circuit breaker 140 for performing estimation of the time for switching, and a network interface capable of communicating over an communication channel. The network interface of the point on wave controller 130 is configured to receive information (referred to as system characteristics data) about the subsystem 160 to which the corresponding circuit breaker 140 is connected. The one or more processors of the point on wave controller 130 are configured to monitor the current of the subsystem 160 in the one phase, determine a first rate of change from the current in the one phase, detect a plurality of instances of switching in the corresponding plurality of phases, and determine a plurality of electrical operating time of the corresponding circuit breaker 140 in the plurality of phases. These aspects are further explained in reference to FIG. 2.

It is to be noted by a person skilled in the art that the subsystem 160 mentioned herein includes electrical elements and devices such as transmission lines, power transformers, reactors, capacitor banks, shunt reactors, motor loads, etc., which are capable of drawing power from the power source 110.

Additionally, it is to be noted that communication of current measurement from the current transformers 120 and 150, to the point on wave controller 130 can be performed in a plurality of ways using networks and corresponding network configurations known to the person skilled in art. Similarly, it is to be noted by a person skilled in the art that while FIG. 1 shows the circuit breaker 140, similar switching devices can also be used in place of the circuit breaker 140. Similarly, it is to be noted that the electrical system 100 which includes the subsystem 160, can include a plurality of phases. In other words, the electrical system 100 is a multiphase electrical system.

Figure 2:
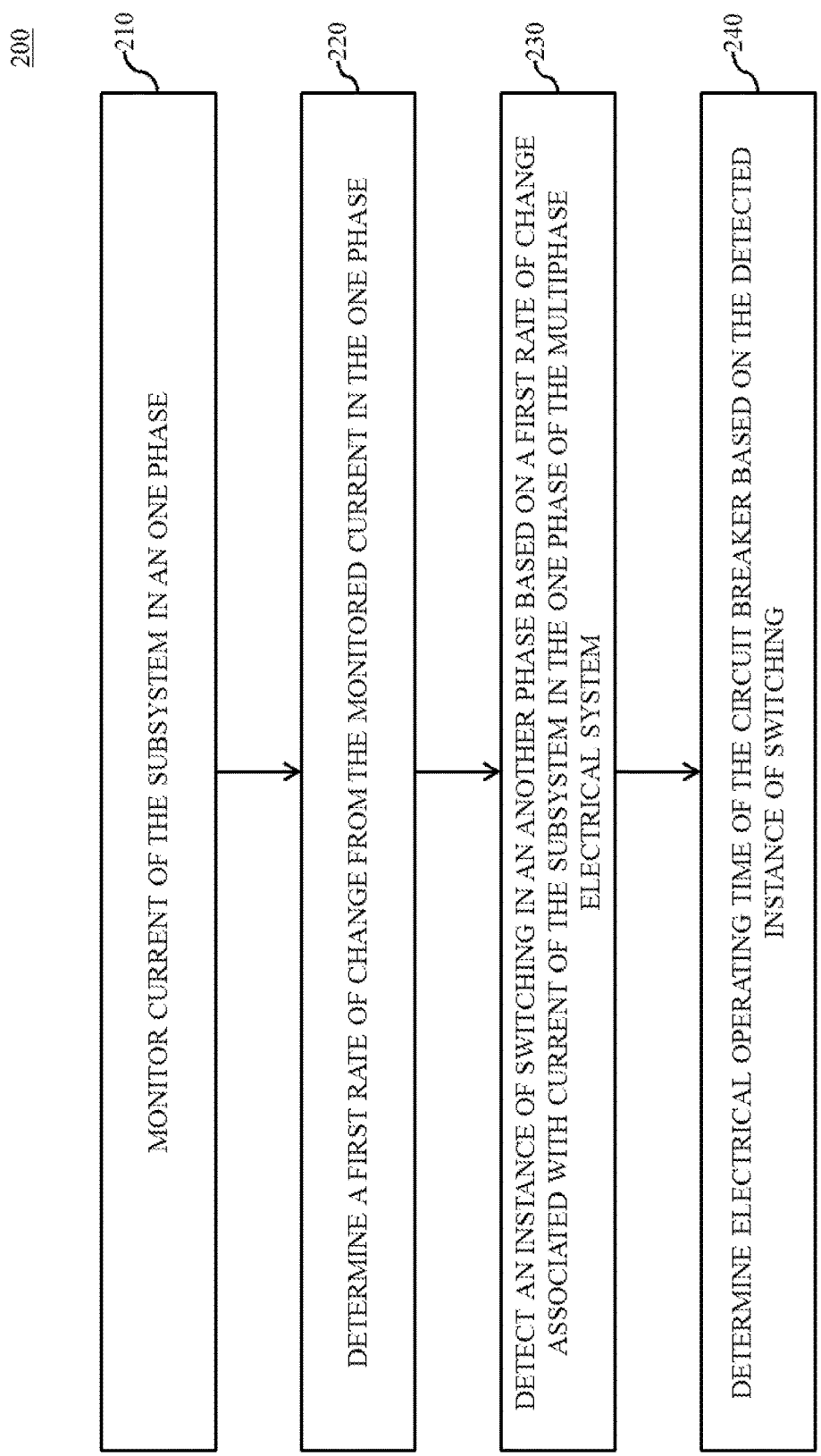
FIG. 2 is a flowchart of a method for determining an electrical operating time of a circuit breaker in the multiphase electrical system using a controller, in accordance with various embodiments of the present invention.

FIG. 2 is a flowchart of a method 200 of performing point on wave switching in the in the multiphase electrical system 100 having the power source 110 connectable to the subsystem 160 through the circuit breaker 140 operated or controlled by the point on wave controller 130. The controller 130 is connected to the current transformer (120 or 150) for measuring current of the subsystem 160 in the one phase of the subsystem 160.

At step 210, the controller 130 monitors the current of the subsystem 160 in the one phase through the current transformer (120 or 150). The current transformer (120 or 150) continuously measures the current of the subsystem 160 and sends sampled values of the current in the one phase to the controller 130. At step 220, based on the sampled values, the controller 130 determines the first rate of change associated with the current of subsystem 160 in the one phase. In an embodiment, the first rate of change is the second order differential derived from the sampled values of the current in the one phase of the subsystem 160.

At step 230, the controller 130 detects an instance of switching in an another phase of the subsystem 160, based on the first rate of change of current of the subsystem 160 in the one phase of the multiphase electrical system 100. The one phase and the another phase of the subsystem 160 are coupled to each other (by electro static or electrodynamic means). In an embodiment, when the switching operation performed was a closing operation, the one phase closes prior to the closing of the another phase. Similarly, when the switching operation performed was an opening operation, the one phase opens subsequent to the opening of the another phase. In other words, the another phase is one of a phase that succeeds the one phase in a sequence of switching during a closing operation or a phase that precedes the one phase in a sequence of switching during a opening operation.

Based on the first rate of change of current in the one phase, the controller 130 detects the instance of switching in the another phase of the subsystem 160. In an embodiment, the controller 130 compares the determined first rate of change to a predetermined threshold. Whenever the value of the first rate of change is greater than the predetermined threshold, the controller 130 determines that switching has happened and the instance at which the value of the first rate of change is greater than the predetermined threshold, is detected as the instance of switching. In an embodiment, the predetermined threshold is based on a percentage of the rated current of the subsystem 160.

In an embodiment, the controller 130 monitors the current in the one phase through the current transformer 120 within a predetermined window. The predetermined window is prior to an opening operation or subsequent to a closing operation. The current transformer 120 continuously measures the current in the one phase and sends sampled values of the current in the one phase to the controller 130. Based on the sampled values within a predetermined window, the controller 130 determines a second rate of change associated with the current in the one phase within the predetermined window.

In an embodiment when the switching operation was a closing operation, the predetermined window is a time period or time window between a first or start instance and a second or end instance. The first instance is determined from the instance at which the command for switching the another phase was given to the circuit breaker 140, by adding the mechanical operating time of the circuit breaker in the another phase along with a preset tolerance value. In an embodiment, the preset tolerance value is a multiple of a time period of a cycle of the current in the one phase. The second instance is determined by adding any multiple of the time period of half cycle of the current in the one phase.

In an embodiment when the switching operation was a opening operation, the predetermined window is a time period or time window between a first or start instance and a second or end instance. The second instance is determined as the instance at which the command for switching the another phase was given to the circuit breaker 140. The first instance is determined by subtracting any multiple of the time period of half cycle of the current in the one phase.

In an embodiment, the second rate of change is a maximum value of second differential in the predetermined window, calculated from the sampled values of the current in the one phase. In yet another embodiment, the second rate of change is determined by calculating an average of values derived by taking the second-order differential of the sampled values of the current in the one phase in the predetermined window.

In an embodiment, when the switching operation was a closing operation, the second rate of change is not available during the actual instance of switching as the second rate of change is calculated within the predetermined window subsequent to the actual instance of switching. Therefore, the controller 130 begins to calculate the first rate of change from the instance at which a command for switching in the another phase was given and continues to calculate and store a multitude of values of instantaneous first rate of change in a buffer along with time information at which the corresponding value of instantaneous first rate of change of current in the one phase was calculated. This calculation and storage of the instantaneous values of first rate of change is carried out till the second rate of change becomes available i.e. till the second instance of the predetermined window as mentioned previously. Then, the controller 130 determines a plurality of ratios based on the multitude of values of instantaneous first rate of change in a buffer and the second rate of change. When a value of a ratio from the plurality of ratios is above a predetermined threshold, the controller 130 detects that an instance of switching had taken place in the another phase at a time instance indicated by the corresponding time information stored in the buffer.

In an embodiment, when the switching operation was a opening operation, the controller 130 determines a ratio based on the first rate of change and the second rate of change. When the value of the ratio is above a predetermined threshold, the controller 130 detects that an instance of switching had taken place in the another phase.

Figure 3:
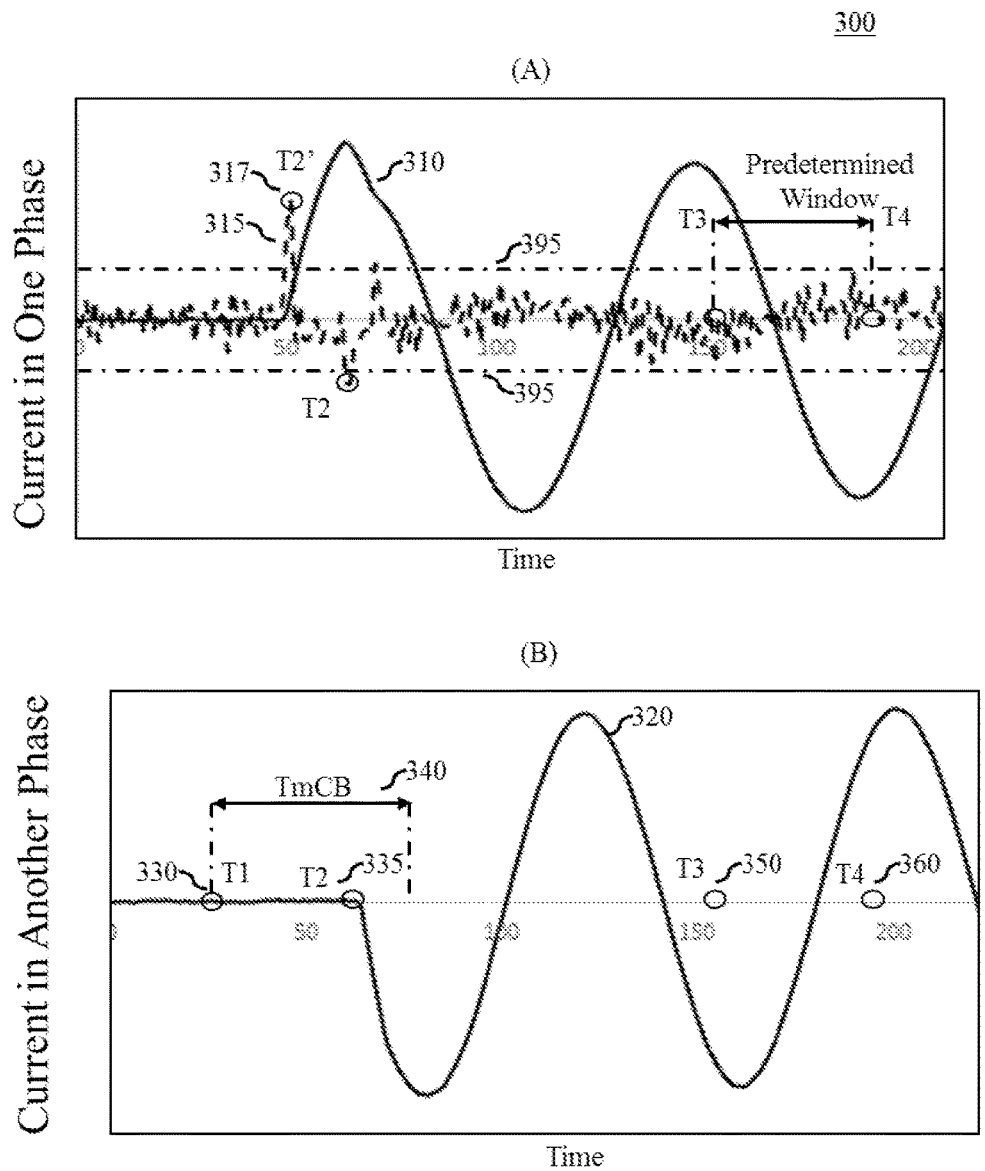
FIG. 3 illustrates waveform of current in a subsystem in a one phase and waveform of current in the subsystem in an another phases during a closing operation, in accordance with various embodiments of the present invention.

The steps 210-230 are further illustrated using an exemplary closing operation as shown in FIG. 3. In FIG. 3, current waveform associated with the subsystem 160 in the one phase is shown in section A of the figure and current waveform associated with the subsystem 160 in the another phase is shown in section B of the figure during a closing operation. The current in the one phase is shown as solid waveform 310 and the first rate of change (second order differential in the current example) of the current in the one phase is shown as dotted waveform 315. Similarly, current in the another phase is shown as solid waveform 320. As mentioned previously, the one phase closes prior to the closing or switching in the another phase.

At T1 (shown in the figure as dot 330), a command for closing or connecting the subsystem 160 to power source 110 in the another phase was given to the circuit breaker 140. At T2 (shown in the figure as dot 335), an electrical connection is established between the power source 110 and the subsystem 160 in the another phase via the circuit breaker 140.

As seen from FIG. 3, a first sharp change in the first rate of change (i.e. second order differential of the current in the one phase) is observed at T2' (shown in the figure as dot 317). T2' is the instance at switching or closing happened in the one phase. Subsequent to T2' and prior to T2, the first rate of change i.e. second order differential of the current of the subsystem 160 in the one phase is relatively around a value or within a band as such. However at the instance when the close operation in the another phase takes place (i.e. T2) there is a sharp change (in the example sharp increase and immediate decrease) in the second order differential of the current of the subsystem 160 in the one phase.

Subsequent to the sharp oscillation resulting due to change in current in the subsystem 160 in the one phase because of the connection of the subsystem 160 to the power source 110 in the another phase, the first rate of change stabilizes and is relatively around a value or within a band as such. Accordingly, the controller 130 detects an instance of switching when the magnitude of the first rate of change (i.e. waveform 325) associated with the current of the subsystem 160 is above a predetermined threshold (indicated as a band using dot-dash lines 395).

In an embodiment, as previously explained, the controller 130 detects an instance of switching based on the ratio of the first rate of change of current in the one phase and the second rate of change of current in the one phase within the predetermined window. As explained previously, during a closing operation, the second rate of change is not available during the actual instance of switching (i.e. T2 in the current example), since the second rate of change is calculated within the predetermined window which is subsequent to the actual instance of switching. As mentioned previously, the predetermined time window is calculated as the time period or time window between an first or start instance and a second or end instance. In the current example, the first or start instance is calculated by adding the mechanical operating time of the circuit breaker 140 (shown in the figure as $T_{mCB}$ 340) along with a preset tolerance value of one cycle to the instance at which command to switch in the another phase was given to the circuit breaker 140 (i.e T1). In the figure, the first or start instance is illustrated as T3 (dot 350). The second instance is calculated by adding time period of half cycle of current to the first instance. In the figure, the second or end instance is illustrated as T4 (dot 360). The predetermined window lies between the instance T3 and T4. In current example, the second rate of change is the maximum value of the second differential of current in the one phase within the predetermined window (i.e. between T3 and T4).

As mentioned previously since the second rate of change is available after the actual instance of switching in the another phase i.e. (T2), the controller 130 begins to calculate the first rate of change from the instance at which a command for switching in the another phase is given (i.e. T1 in the current example) and continues to calculate and store a multitude of values of instantaneous first rate of change in a buffer along time information which the corresponding value of instantaneous first rate of change of current in the one phase was calculated, till the second rate of change becomes available i.e. till the second instance or end instance of the predetermined window (T4). Then, the controller 130 determines a plurality of ratios based on the multitude of values of instantaneous first rate of change in a buffer and the second rate of change. When a value of a ratio from the plurality of ratios is above a predetermined threshold (which happens at T2), the controller 130 detects that an instance of switching had taken place at a time instance indicated by the corresponding time information stored in the buffer (i.e. T2). By utilizing the second rate of change, the controller 130 is able to normalize the first rate of change and is able to accommodate for the noises or disturbances seen in the current in the one phase which are unrelated to the switching.

Figure 4:
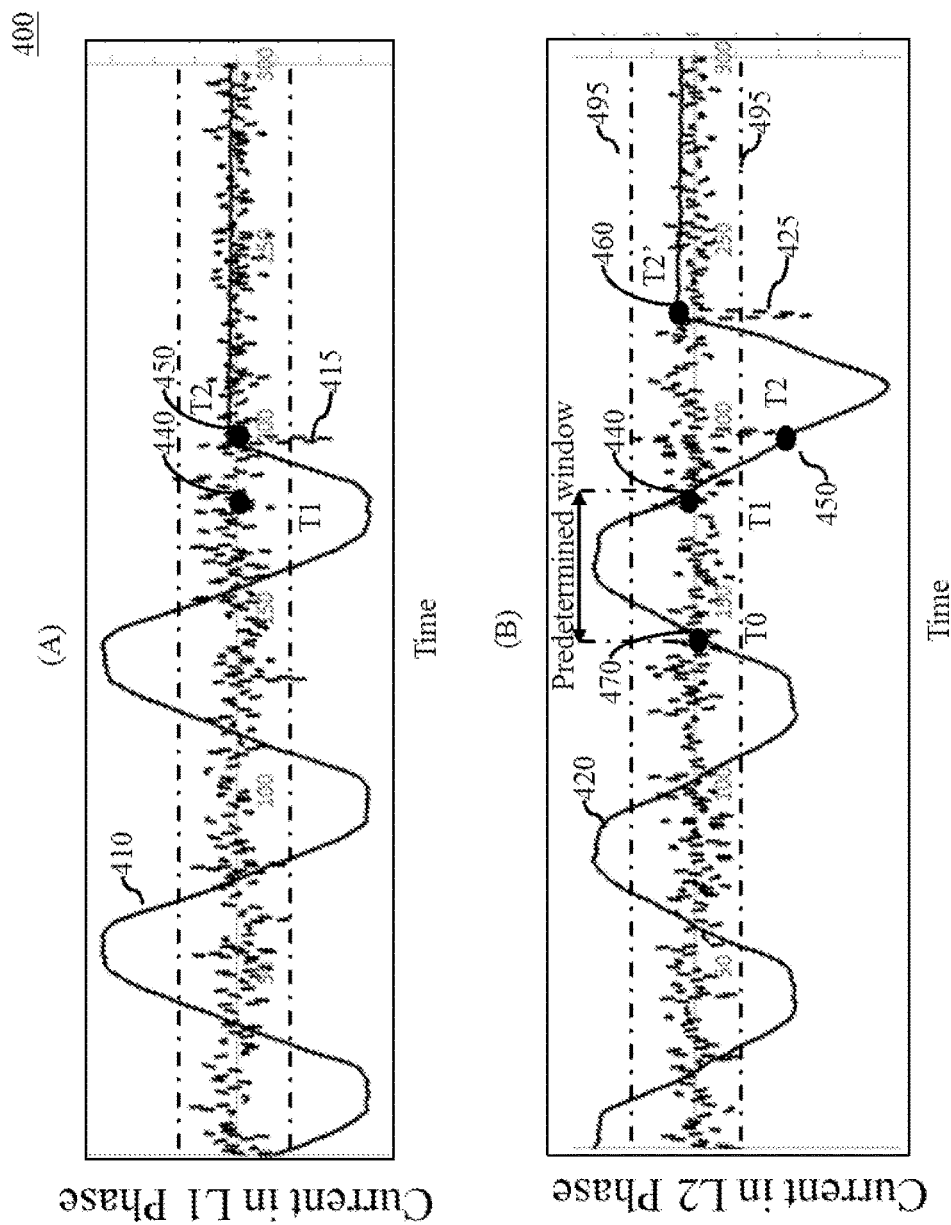
FIG. 4 illustrates waveforms of current in a subsystem in a one phase, and an another phase during an opening operation, in accordance with various embodiments of the present invention.

Similarly, the steps 210-230 are explained using an exemplary opening operation as illustrated in FIG. 4. In the current example illustrated in the FIG. 4, the subsystem 160 is a transformer with inter-phase coupling (i.e. energization of one phase induces affects the current in the remaining phases). In the current example, the current in L2 phase of the subsystem 160 is monitored by the controller 130, and the current of L1 of the transformer 160 is not monitored directly. Additionally, as mentioned previously, the one phase which is monitored i.e. L2 in the current examples, opens subsequent to the opening in the L1 phase.

In FIG. 4, current waveform associated with the L1 phase is shown in section A of the figure and current waveform associated with the L2 phase is shown in section B of the figure during the opening operation. The current in the L1 phase is shown as solid waveform 410 and a rate of change (second order differential in the current example) of the current in the L1 phase is shown as dotted waveform 415.

Similarly, current in L2 phase is shown as solid waveform 420 and the first rate of change (second order differential in the current example) of the current in L2 is shown as dotted waveform 425.

At T1 (shown in the figure as dot 430), a command for opening or disconnecting the transformer 160 to power source 110 in phase L1 was given to the circuit breaker 140. At T2 (shown in the figure as dot 440), an electrical connection is interrupted between the power source 110 and the subsystem 160 in the L1 phase via the circuit breaker 140. At T2' (shown in the figure as dot 460), an electrical connection is interrupted between the power source 110 and the subsystem 160 in the L2 phase via the circuit breaker 140.

Prior to T2, the first rate of change i.e. second order differential of the current of the subsystem 160 in the one phase (i.e. the L2 phase) is relatively around a value or within a band as such.

However at the instances (T2, and T2') when switching happens in any of the two phases there is a sharp change in the second order differential of the current of the subsystem 160 in the L2 phase. Due to interphase coupling, whenever a switching operation takes places in L1, the current in L2 is also affected. Subsequent to the sharp oscillation resulting due to change in current in the subsystem 160 in the L2 phase because of the switching in the L1 phase (i.e. at T2), the first rate of change stabilizes and is relatively around a value or within a band as such till the switching in L2 phase (T2').

Accordingly, the controller 130 detects instances of switching in the two phases based on the first rate of change of current in the L2 phase. In an embodiment, the controller 130 detects an instance of switching when the magnitude of the first rate of change associated with the current of the subsystem 160 in the one phase (i.e. L2 phase) is above a predetermined threshold (indicated as a band using dot-dash lines 495).

In another embodiment, as previously explained, the controller 130 derives the second rate of change of current in L2 phase within the predetermined window. In the current example, the predetermined window is a time period or time window between a first or start instance and a second or end instance. The second instance is determined as the instance at which the command for switching the another phase was given to the circuit breaker 140 (i.e. the instance T1). The first instance is determined by subtracting any multiple of the time period of half cycle of the current in the L2 phase. In the current example, the first instance is indicated as T0 (shown in the figure as dot 470). In the current example, the second rate of change is a maximum value of the second order differential of the current in the L2 phase within the predetermined window (i.e. between T0 and T1).

Then, the controller 130 calculates a ratio of the first rate of change and the second rate of change. The controller 130 detects an instance of switching in L1 phase when the ratio is greater than a predetermined threshold.

At step 240, the controller 130 determines an electrical operating time of the circuit breaker 140 in the another phase, based on the detected instance of switching. The controller 130 determines the electrical operating time of the circuit breaker 140 as the time period between the instance at which the command for switching in the another phase was provided to the circuit breaker 140 (i.e. T1) and the instance at which the electrical connection was established between the power source 110 and the subsystem 160 in the another phase (i.e. T2).

In an embodiment, when a command for next switching is provided to controller 130, the controller 130 estimates a time for the next switching in the another phase based on the determined electrical operating time of the circuit breaker 140 in the another phase and system characteristics data associated with the subsystem 160.

System characteristics data herein refers to information about all parameters relating to the subsystem 160 that are utilized in estimation of time for switching and in switching strategy. System characteristics data includes, but is not limited to, type of subsystem, grounding configuration of the subsystem, lead operating phase associated with the subsystem, polarity sensitivity preference associated with the subsystem, a correction factor associated with subsystem, residual flux or trapped charges associated with the subsystem.

In an embodiment, the system characteristics data includes a correction factor associated with the subsystem 160. When the point on wave controller 130 notices an error in time for switching, the point on wave controller 130 utilizes the correction factor to correct the time for switching in the next estimation. The error correction process is iteratively performed.

In an embodiment, the controller 130 operates the circuit breaker 140 at the estimated time for next switching, for switching the subsystem 160 in the another phase. At the time for switching, the controller 130 issues the command for switching to the circuit breaker 140. The electrical connection between the power source 110 and the subsystem 160 in the another phase is incepted or interrupted at appropriate time instance determined based on the electrical operating time of the circuit breaker 140 in the another phase and the system characteristics of the subsystem 160.

It is to be noted by a person skilled in the art, that switching herein refers to closing or opening of the subsystem 160 using a circuit breaker 140. Additionally, it is to be noted by a person skilled in the art that that the term one phase has been used to identify a particular phase in the system 100. It also to be noted by a person skilled in the art, that while the calculation of the second rate of change has been described by calculating the second rate of change of the current in the one phase, current in any other phase in the subsystem 160 can also be used as well.

In an embodiment, the controller 130 can detect a plurality of instances of switching in corresponding phases by monitoring the first rate of change of current of the subsystem 160 in the one phase when the plurality of phases of the subsystem 160 are coupled with the one phase.

It is to be noted by a person skilled in the art that while the above method is explained for detecting an instance of switching in the another phase by monitoring the first rate of change of current of the subsystem 160 in the one phase, the method can be extended to detecting a plurality of instances of switching associated with corresponding phases by monitoring the first rate of change of the current in the one phase of subsystem 160.

In an embodiment, the system characteristics data associated with the subsystem 160 includes a predetermined sequence of switching associated with the one or more phases of the subsystem 160. Based on the predetermined sequence of switching, the controller 130 associates the plurality of instances of switching detected by monitoring a single phase (i.e. the one phase), with the corresponding phases to determine electrical operating time of the circuit breaker 140 in each phase. Continuing the example illustrated in FIG. 4, based on the first rate of change, the controller 130 detects two instances of switching i.e. T2, and T2'. The predetermined sequence of switching (as seen from the figure as well) is L1, and L2. Accordingly, the controller 130 can associate T2 as the instance at which L1 was opened, T2' as the instance at which L2 was opened. Then, the controller 130 can calculate the electrical operating time for each phase by comparing the instance at which the switching happened for that phase against the instance at which the command to close was given.

In an embodiment, the power source 110 is noisy and the current of the power source 110 includes certain undesired harmonics in it. For capacitive loads, when performing switching near voltage zero crossing point across the circuit breaker 140, it is difficult to differentiate between the influence of noise in current of the subsystem 160 arising due to the noisy power source 110 and switching operation, in the rate of change of current of the subsystem 160. Therefore, the controller 130 cannot rely on absolute value of the magnitude of the first rate of change associated with the current of the subsystem 160 in the one phase. To counter the effects of noise arising due to the noisy power source 110, the ratio calculated from the first rate of change and the second rate of change, as previously described, is utilized by the controller 130 in detecting the instance of switching. By utilizing the ratio of the first rate of change and the second rate of change, noise generated by the noisy power source 110 can be effectively negated while detecting an instance of switching.

In an embodiment, the controller 130 is configured to switch from detecting a plurality of instances of switching by monitoring a plurality of rate of change of current associated with a plurality of phases as conventionally known, to detecting a plurality of instances of switching associated with a plurality of phases by monitoring a first rate of change of current of subsystem 160 in a one phase, as illustrated by the method 200. This is particularly of use, when one or more rate of change associated with one or more phases is no longer available and the first rate of change associated with current of the subsystem 160 in the one phase is still available.

When a plurality of instances of switching are detected by monitoring a rate of change of current in the one phase, in an embodiment, the controller 130 is configured to change the sequence of switching to ensure that one phase on which the current is being monitored, is one of a last phase to open and a first phase to close. In an embodiment, when one or more rate of changes associated with one or more phases are unavailable, the controller 130 is configured to change the sequence of switching to ensure that the unavailable phases (i.e. phases where the rate of change of current information is unavailable or unreliable) are among the last phases to close and among the first phases to open.

In an embodiment, the controller 130 monitors current in one or more phases from the plurality of phases of the subsystem 160. The controller 130 is configured to select the one phase (i.e. the phase used to detect the plurality of instances of switching) from the one or more phases. Subsequent to switching, the controller 130 determines a first ratio of the first rate of change and second rate of change in a first phase from the two or more phases, and a second ratio of the first rate of change and the second rate of change in a second phase of the one or more phases. Based the first ratio and the second ratio, the controller 130 selects either the first phase or the second phase as the one phase for detecting the instance of switching. In an example, when the first ratio is greater than the second ratio, the first phase is selected as the one phase. In another example, when the second ratio is greater than the first ratio, the second phase is selected as the one phase.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method (200) of determining an electrical operating time of a circuit breaker (140) for performing point on wave switching in a multiphase electrical system (100) having a subsystem (160) connectable to a power source (110), through the circuit breaker (140) operated by a controller (130), wherein the controller (130) is connected to a current transformer (150) for measuring current of the subsystem (160) in a one phase, the method (200) comprising:
   a. monitoring (210) the current of the subsystem (160) in the one phase;
   b. determining (220) a first rate of change from the monitored current in the one phase;
   c. detecting (230) an instance of switching in an another phase based on the first rate of change (325) associated with current of the subsystem (160) in the one phase of the multiphase electrical system, wherein the another phase is one of a phase that succeeds the one phase in a sequence of switching during a closing operation, and a phase that precedes the one phase in a sequence of switching during a opening operation; and
   d. determining (240) an electrical operating time of the circuit breaker (140) in the another phase based on the detected instance of switching and an instance at which a command for switching in the another phase was provided to the circuit breaker (140).

2. The method as claimed in claim 1, wherein the one phase is one of a last phase in a sequence of switching during the opening operation and a first phase in a sequence of switching during the closing operation.

3. The method as claimed in claim 1, further comprising estimating a time for switching in the another phase the circuit breaker (140), based on the determined electrical operating time of the circuit breaker (140) in the another phase and system characteristics data associated with the subsystem (160).

4. The method as claimed in claim 1, further comprising associating the detected instance of switching with the another phase based a predetermined sequence of switching.

5. The method as claimed in claim 1, wherein detecting the at least one instance of switching further comprises:
   i. monitoring current of the subsystem (160) in at least one phase through a current measuring means;
   ii. calculating at least one second rate of change from the current in the at least one phase within a predetermined window; and
   iii. determining a ratio based on the first rate of change and the at least one second rate of change for detecting the instance of switching in the another phase.

6. The method as claimed in claim 1, further comprising:
   a. selecting the one phase from one or more phases from a plurality of phases of the multiphase electrical system (100), wherein current from each phase of the one or more phases is monitored by the controller (130); and
   b. modifying a sequence of switching whereby the one phase is one of a first phase to close during a closing operation and a last phase to open during an opening operation.

7. A controller (130) configured to operate a circuit breaker (140) in a multiphase electrical system (100) having a subsystem (160) connectable to a power source (110), wherein the controller (130) is connected to a current transformer (145) for measuring current of the subsystem (160) in a one phase, the controller (130) comprising:
   a. one or more processors configured to
      i. monitor the current of the subsystem (160) in the one phase,
      ii. determine a first rate of change from the monitored current in the one phase,
      iii. detect an instance of switching in an another phase based on the first rate of change of current of the subsystem (160) in the one phase of the multiphase electrical system,
      iv. determine an electrical operating time of the circuit breaker (140) in the another phase, based on the detected instance of switching,
      v. estimate a time for switching in the another phase based on the determined electrical operating time of the circuit breaker (140) and system characteristics data associated with the subsystem (160); and
   b. a memory module functionally coupled to the one or more processors.

* * * * *